United States Patent
Trend et al.

(10) Patent No.: US 9,634,660 B2
(45) Date of Patent: Apr. 25, 2017

(54) TOUCH SENSOR WITH REDUCED ANTI-TOUCH EFFECTS

(75) Inventors: Matthew Trend, Fareham (GB); Samuel Brunet, Cowes (GB); David B. Guard, Southampton (GB); Luben H. Hristov, Sofia (BG)

(73) Assignee: Atmel Corporation, San Jose, CA (US)

( * ) Notice: Subject to any disclaimer, the term of this patent is extended or adjusted under 35 U.S.C. 154(b) by 306 days.

(21) Appl. No.: 13/330,257

(22) Filed: Dec. 20, 2011

(65) Prior Publication Data

US 2013/0155000 A1 Jun. 20, 2013

(51) Int. Cl.
*G06F 3/041* (2006.01)
*H03K 17/96* (2006.01)
*G06F 3/044* (2006.01)

(52) U.S. Cl.
CPC ......... *H03K 17/9622* (2013.01); *G06F 3/044* (2013.01); *H03K 2017/9602* (2013.01)

(58) Field of Classification Search
CPC ........... G06F 3/041; G06F 2203/04103; G06F 2203/04107; G06F 2203/04111; G06F 3/044; H03K 17/975; H03K 17/9622; H03K 2017/9602
USPC ..... 178/18.01–18.07, 19.01, 19.03; 345/169, 345/173–178
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,321 B2 * | 10/2011 | Peng et al. | 345/169 |
| 8,040,326 B2 | 10/2011 | Hotelling | |
| 8,049,732 B2 | 11/2011 | Hotelling | |
| 8,144,125 B2 * | 3/2012 | Peng et al. | 345/173 |
| 8,179,381 B2 | 5/2012 | Frey | |
| 8,199,127 B2 * | 6/2012 | Mamba et al. | 345/174 |
| 8,279,187 B2 * | 10/2012 | Geaghan | 345/173 |
| 8,416,207 B2 * | 4/2013 | Kasajima | 345/173 |
| 8,487,898 B2 * | 7/2013 | Hotelling | 345/174 |
| 8,493,349 B2 * | 7/2013 | Hwang et al. | 345/173 |
| 2006/0066581 A1 * | 3/2006 | Lyon | G06F 3/044 345/173 |

(Continued)

FOREIGN PATENT DOCUMENTS

| | | |
|---|---|---|
| CN | 101520708 A | 9/2009 |
| CN | 101625614 A | 1/2010 |

(Continued)

OTHER PUBLICATIONS

U.S. Appl. No. 61/454,936, filed Mar. 21, 2011, Myers.

(Continued)

*Primary Examiner* — Kent Chang
(74) *Attorney, Agent, or Firm* — Baker Botts L.L.P.

(57) ABSTRACT

In an embodiment, a system comprises a touch sensor. The touch sensor comprises an insulating substrate and a plurality of electrodes disposed on the insulating substrate. The plurality of electrodes comprises a drive line having a plurality of drive electrodes and a sense line having a plurality of sense electrodes. At least one of the electrodes comprises a first conductive material having a hole portion substantially free of the first conductive material.

17 Claims, 14 Drawing Sheets

(56) References Cited

U.S. PATENT DOCUMENTS

| | | | | |
|---|---|---|---|---|
| 2007/0074914 | A1* | 4/2007 | Geaghan | G06F 3/044 |
| | | | | 178/18.06 |
| 2009/0194344 | A1* | 8/2009 | Harley et al. | 178/18.06 |
| 2009/0213090 | A1* | 8/2009 | Mamba | G06F 3/044 |
| | | | | 345/174 |
| 2009/0315854 | A1 | 12/2009 | Matsuo | |
| 2010/0026664 | A1* | 2/2010 | Geaghan | G06F 3/044 |
| | | | | 345/174 |
| 2010/0045614 | A1* | 2/2010 | Gray | G06F 3/044 |
| | | | | 345/173 |
| 2011/0025629 | A1* | 2/2011 | Grivna | G06F 3/0416 |
| | | | | 345/173 |
| 2011/0025639 | A1 | 2/2011 | Trend et al. | |
| 2011/0175671 | A1* | 7/2011 | Reynolds | 327/517 |
| 2011/0199333 | A1* | 8/2011 | Philipp et al. | 345/174 |
| 2011/0291963 | A1* | 12/2011 | Woo et al. | 345/173 |
| 2012/0075230 | A1* | 3/2012 | Nagata | G06F 3/044 |
| | | | | 345/173 |
| 2012/0169651 | A1* | 7/2012 | Chang | G06F 3/0418 |
| | | | | 345/174 |
| 2012/0229414 | A1* | 9/2012 | Ellis | G06F 3/044 |
| | | | | 345/174 |
| 2012/0242588 | A1 | 9/2012 | Myers | |
| 2012/0242592 | A1 | 9/2012 | Rothkopf | |
| 2012/0243151 | A1 | 9/2012 | Lynch | |
| 2012/0243719 | A1 | 9/2012 | Franklin | |

FOREIGN PATENT DOCUMENTS

| | | |
|---|---|---|
| CN | 101813844 A | 8/2010 |
| CN | 101847071 A | 9/2010 |
| CN | 201622554 U | 11/2010 |
| CN | 101937293 A | 1/2011 |
| CN | 101943975 A | 1/2011 |
| CN | 101995993 A | 3/2011 |
| TW | 201102901 A | 1/2011 |
| TW | 201112085 A | 4/2011 |
| WO | WO 2012/129247 | 9/2012 |

OTHER PUBLICATIONS

U.S. Appl. No. 61/454,950, filed Mar. 21, 2011, Lynch.
U.S. Appl. No. 61/454,894, filed Mar. 21, 2011, Rothkopf.
Chinese First Office Action and Search Report Application No. 201210557374.4 Issued by State Intellectual Property Office (with translation).
Taiwan Patent Office Communication regarding Patent Application No. 101148511 (with translation), Jun. 23, 2016.
Chinese Second Office Action and Search Report Application No. 201210557374.4 Issued by State Intellectual Property Office (with translation), dated Dec. 30, 2016.

\* cited by examiner

TOUCH SENSOR WITH REDUCED ANTI-TOUCH EFFECTS

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

Touch sensors may include certain electrode patterns that have varying effect on the change in capacitance by a touching object. For example, electrode patterns using a standard double diamond configuration may not mitigate anti-touch effects.

DESCRIPTION OF EXAMPLE EMBODIMENTS

Figure 1:
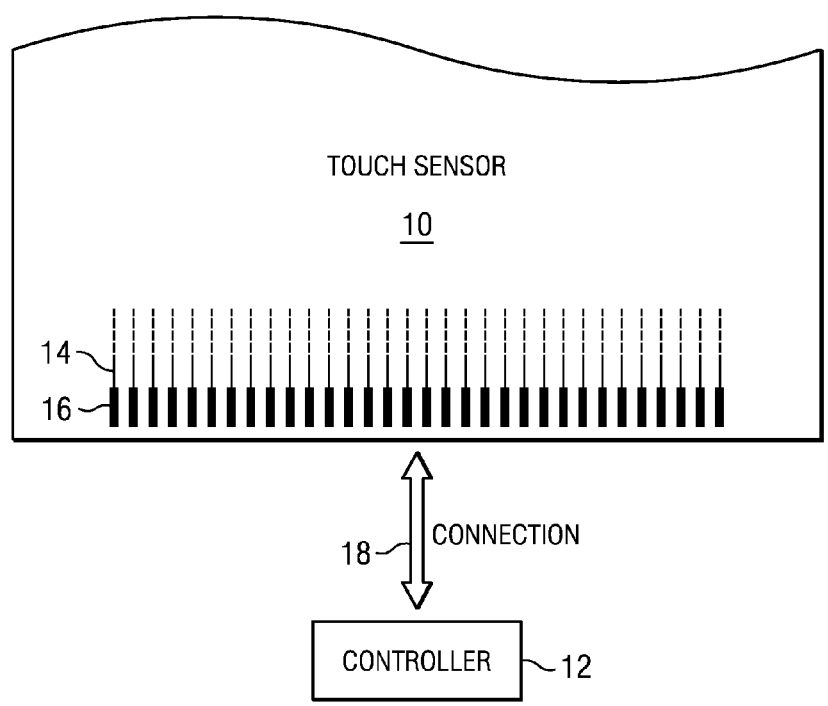
FIG. 1 illustrates an example touch sensor with an example controller.

FIG. 1 illustrates an example touch sensor 10 with an example touch-sensor controller 12. Touch sensor 10 and touch-sensor controller 12 may detect the presence and location of a touch or the proximity of an object within a touch-sensitive area of touch sensor 10. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 10 may include one or more touch-sensitive areas, where appropriate. Touch sensor 10 may include an array of drive and sense electrodes (or an array of electrodes of a single type) disposed on one or more substrates, which may be made of a dielectric material. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a drive electrode or a sense electrode) may be an area of conductive material forming a shape, such as for example a disc, square, rectangle, thin line other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, or a copper- or silver-based material, and the fine lines of conductive material may occupy approximately 5% of the area of its shape in a hatched, mesh, or other suitable pattern. Herein, reference to FLM encompasses such material, where appropriate. Although this disclosure describes or illustrates particular electrodes made of particular conductive material forming particular shapes with particular fills having particular patterns, this disclosure contemplates any suitable electrodes made of any suitable conductive material forming any suitable shapes with any suitable fill percentages having any suitable patterns.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 10. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of PET or another suitable material, similar to the substrate with the conductive material forming the drive or sense electrodes). As an alternative, where appropriate, a thin coating of a dielectric material may be applied instead of the second layer of OCA and the dielectric layer. The second layer of OCA may be disposed between the substrate with the conductive material making up the drive or sense electrodes and the dielectric layer, and the dielectric layer may be disposed between the second layer of OCA and an air gap to a display of a device including touch sensor 10 and touch-sensor controller 12. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of the substrate of touch sensor 10 may be made of polyethylene terephthalate (PET) or another suitable material. This disclosure contemplates any suitable substrate with any suitable portions made of any suitable material. In particular embodiments, the drive or sense electrodes in touch sensor 10 may be made of ITO in whole or in part. In particular embodiments, the drive or sense electrodes in touch sensor 10 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. This disclosure contemplates any suitable electrodes made of any suitable material.

Touch sensor 10 may implement a capacitive form of touch sensing. In a mutual-capacitance implementation, touch sensor 10 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 12) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 12 may measure the change in capacitance. By measuring changes in capacitance throughout the array, touch-sensor controller 12 may determine the position of the touch or proximity within the touch-sensitive area(s) of touch sensor 10.

In a self-capacitance implementation, touch sensor 10 may include an array of electrodes of a single type that may each form a capacitive node. When an object touches or comes within proximity of the capacitive node, a change in self-capacitance may occur at the capacitive node and touch-sensor controller 12 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 12 may determine the position of the touch or proximity within the touch-sensitive area(s) of touch sensor 10. This disclosure contemplates any suitable form of capacitive touch sensing, where appropriate.

In particular embodiments, one or more drive electrodes may together form a drive line running horizontally or vertically or in any suitable orientation. Similarly, one or more sense electrodes may together form a sense line running horizontally or vertically or in any suitable orientation. In particular embodiments, drive lines may run substantially perpendicular to sense lines. Herein, reference to a drive line may encompass one or more drive electrodes making up the drive line, and vice versa, where appropriate. Similarly, reference to a sense line may encompass one or more sense electrodes making up the sense line, and vice versa, where appropriate.

Touch sensor 10 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 10 may have drive electrodes disposed in a pattern on one side of a substrate and sense electrodes disposed in a pattern on another side of the substrate. Moreover, touch sensor 10 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other—instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

As described above, a change in capacitance at a capacitive node of touch sensor 10 may indicate a touch or proximity input at the position of the capacitive node. Touch-sensor controller 12 may detect and process the change in capacitance to determine the presence and location of the touch or proximity input. Touch-sensor controller 12 may then communicate information about the touch or proximity input to one or more other components (such one or more central processing units (CPUs)) of a device that includes touch sensor 10 and touch-sensor controller 12, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 12 may be one or more integrated circuits (ICs), such as for example general-purpose microprocessors, microcontrollers, programmable logic devices or arrays, application-specific ICs (ASICs). In particular embodiments, touch-sensor controller 12 comprises analog circuitry, digital logic, and digital non-volatile memory. In particular embodiments, touch-sensor controller 12 is disposed on a flexible printed circuit (FPC) bonded to the substrate of touch sensor 10, as described below. The FPC may be active or passive, where appropriate. In particular embodiments, multiple touch-sensor controllers 12 are disposed on the FPC. Touch-sensor controller 12 may include a processor unit, a drive unit, a sense unit, and a storage unit. The drive unit may supply drive signals to the drive electrodes of touch sensor 10. The sense unit may sense charge at the capacitive nodes of touch sensor 10 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within the touch-sensitive area(s) of touch sensor 10. The processor unit may also track changes in the position of a touch or proximity input within the touch-sensitive area(s) of touch sensor 10. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 14 of conductive material disposed on the substrate of touch sensor 10 may couple the drive or sense electrodes of touch sensor 10 to connection pads 16, also disposed on the substrate of touch sensor 10. As described below, connection pads 16 facilitate coupling of tracks 14 to touch-sensor controller 12. Tracks 14 may extend into or around (e.g. at the edges of) the touch-sensitive area(s) of touch sensor 10. Particular tracks 14 may provide drive connections for coupling touch-sensor controller 12 to drive electrodes of touch sensor 10, through which the drive unit of touch-sensor controller 12 may supply drive signals to the drive electrodes. Other tracks 14 may provide sense connections for coupling touch-sensor controller 12 to sense electrodes of touch sensor 10, through which the sense unit of touch-sensor controller 12 may sense charge at the capacitive nodes of touch sensor 10. Tracks 14 may be made of fine lines of metal or other conductive material. As an example and not by way of limitation, the conductive material of tracks 14 may be copper or copper-based and have a width of approximately 100 μm or less. As another example, the conductive material of tracks 14 may be silver or silver-based and have a width of approximately 100 μm or less. In particular embodiments, tracks 14 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 14, touch sensor 10 may include one or more ground lines terminating at a ground connector (which may be a connection pad 16) at an edge of the substrate of touch sensor 10 (similar to tracks 14).

Connection pads 16 may be located along one or more edges of the substrate, outside the touch-sensitive area(s) of touch sensor 10. As described above, touch-sensor controller 12 may be on an FPC. Connection pads 16 may be made of the same material as tracks 14 and may be bonded to the FPC using an anisotropic conductive film (ACF). Connection 18 may include conductive lines on the FPC coupling touch-sensor controller 12 to connection pads 16, in turn coupling touch-sensor controller 12 to tracks 14 and to the drive or sense electrodes of touch sensor 10. In another embodiment, connection pads 16 may be connected to an electro-mechanical connector (such as a zero insertion force wire-to-board connector); in this embodiment, connection 18 may not need to include an FPC. This disclosure contemplates any suitable connection 18 between touch-sensor controller 12 and touch sensor 10.

Figure 2:
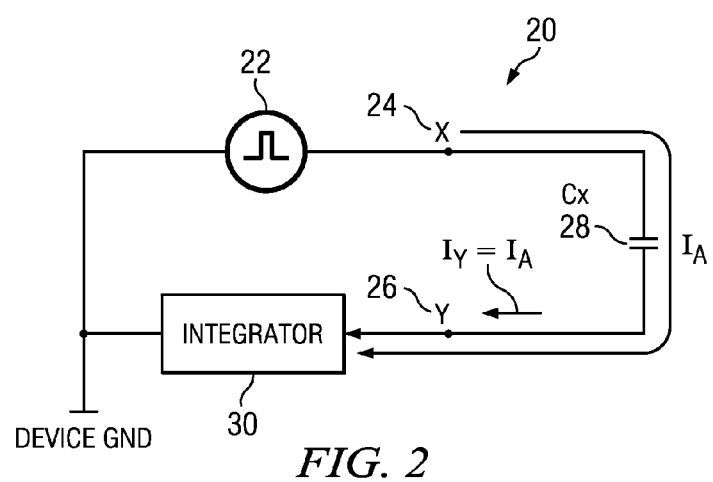
FIG. 2 illustrates an example equivalent circuit for respective drive and sense electrodes of a touch sensor when no touch is occurring.
Figure 3:
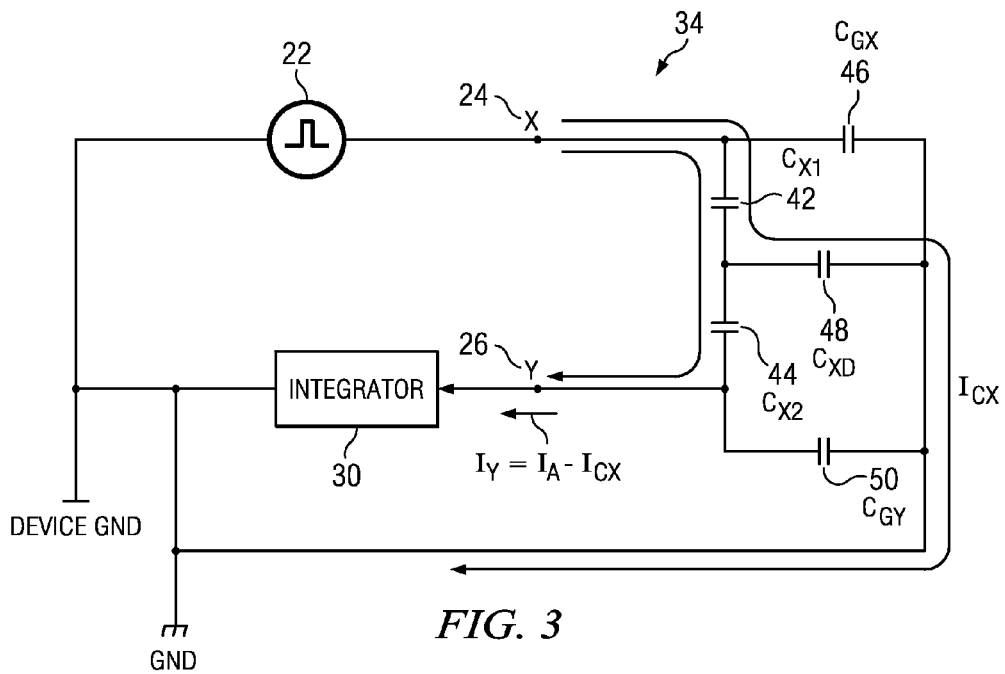
FIG. 3 illustrates an example equivalent circuit for respective drive and sense electrodes of a touch sensor when a touch is occurring.
Figure 4:
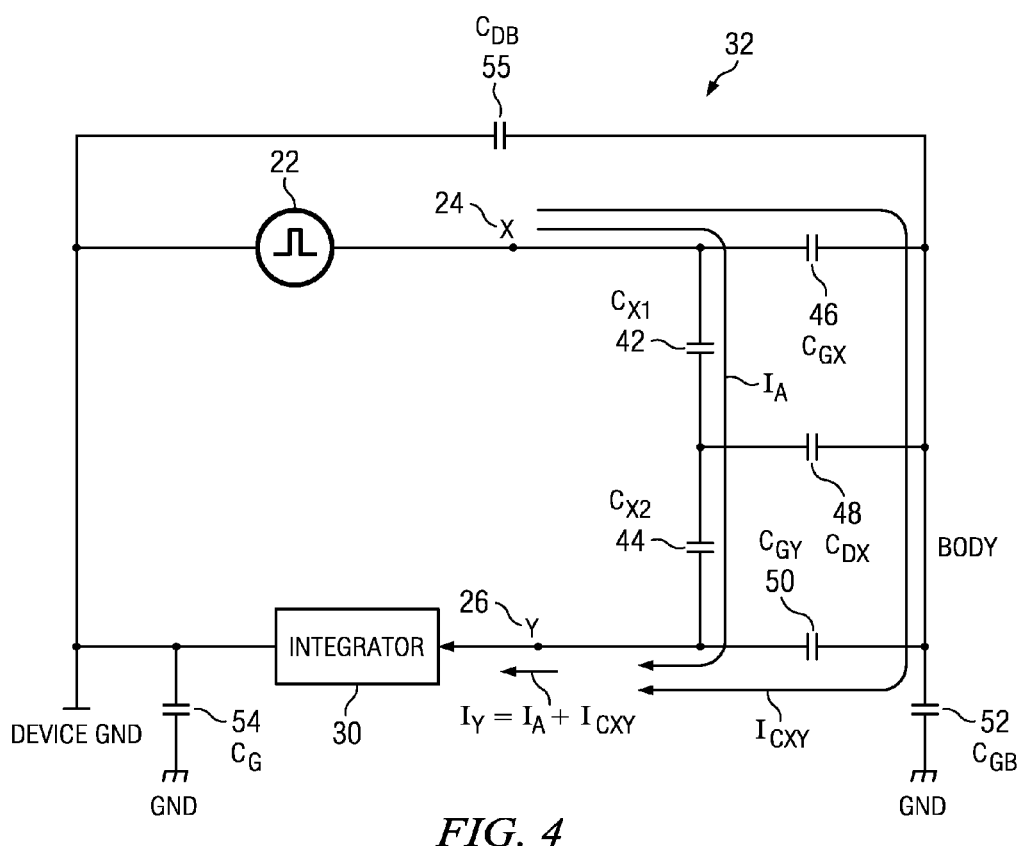
FIG. 4 illustrates another example equivalent circuit for respective drive and sense electrodes of a touch sensor when a touch is occurring.

FIGS. 2-4, as described in more detail below, illustrate example equivalent circuits for respective drive and sense electrodes of a touch sensor. These equivalent circuits provide models useful for analyzing the relevant currents and charge at a sense electrode during various situations. The equivalent circuit of FIG. 2 provides an example model for analyzing current and charge at a sense electrode when no touch is occurring. The equivalent circuit of FIG. 3 provides an example model for analyzing current and charge at a sense electrode when a touch is occurring in a nearly ideal touch scenario. FIG. 4 provides an example model for analyzing current and charge at a sense electrode in a non-ideal touch scenario that approximates real-world conditions. FIGS. 5A-11B illustrate example touch sensors operable to mitigate some of the negative effects introduced in a non-ideal touch scenario.

FIG. 2 illustrates an example equivalent circuit 20 for respective drive and sense electrodes of a touch sensor when no touching is occurring. In particular embodiments, equivalent circuit 20 may represent at least a portion of the circuits of touch sensor 10. Equivalent circuit 20 includes a voltage source 22, drive electrode 24, sense electrode 26, mutual capacitance 28, and integrator 30.

Voltage source 22 applies any suitable voltage to drive electrode 24, such as a pulsed or alternating voltage. In some embodiments, equivalent circuit 20 may use a current source to limit certain currents and the electromagnetic field (EMF). Capacitor 28 represents the mutual capacitance between drive electrode 24 and sense electrode 30 when no touch is occurring. Integrator 30 integrates the current $I_Y$ (or charge) on sense electrode 26 and, in operation, a change in the current $I_Y$ or the transferred charge on drive electrode 24 will be detected. In the embodiment shown in FIG. 2, when no touch is occurring, integrator does not measure any significant change in current $I_Y$ or the charge on sense electrode 26. Equivalent circuit 20 is an example model helpful to analyze current $I_Y$ when no touch is occurring. Other suitable models may exist to analyze current $I_Y$ and to analyze other components that exist but are not shown in the embodiment depicted in FIG. 2. FIGS. 3 and 4 below show other example equivalent circuits for drive and sense electrodes helpful to analyze current $I_Y$ when a touch is occurring. These models incorporate several other additional, representative capacitances.

FIG. 3 illustrates an example equivalent circuit 34 for respective drive and sense electrodes of a touch sensor when a nearly ideal touch is occurring. That is, the touching object is substantially perfectly coupled to ground. In particular embodiments, equivalent circuit 34 may represent at least a portion of the circuits of touch sensor 10. Similar to equivalent circuit 20, equivalent circuit 34 includes voltage source 22, drive electrode 24, sense electrode 26, and integrator 30. These components have functions similar to those described with respect to the corresponding components of FIG. 2. Equivalent Circuit 34 also includes representative capacitors 42, 44, 46, 48 and 50.

Voltage source 22 applies any suitable voltage to drive electrode 24, such as a pulsed or alternating voltage. In some embodiments, equivalent circuit 20 may use a current source to limit certain currents and the EMF. Integrator 30 integrates the current $I_Y$ (or transferred charge) on drive electrode 26. Thus, in operation, a change (relative to when no touch is occurring) in the current $I_Y$ or the transferred charge on drive electrode 24 will be detected. In this way, equivalent circuit 34 detects that a touch is occurring. Capacitor 28 of FIG. 2 is represented as capacitors 42, 44, and 48 in FIG. 3. Since a touch is occurring within sufficient proximity to drive electrode 24 and sense electrode 26, the touching object affects the capacitive field lines between drive electrode 24 and sense electrode 26, changing the capacitance between them. Equivalent circuit 34 includes capacitors 42, 44, and 48 to model the change in capacitance between drive electrode 24 and sense electrode 26 when a touch is occurring, wherein the size of capacitor 48 may increase with stronger touches. In certain embodiments, the stronger the touch of the touching object, the smaller the mutual capacitance becomes between the drive electrode 24 and sense electrode 26. Thus, a stronger touch is represented with a larger capacitor 48. The capacitance between drive electrode 24 and the touching object is represented as capacitor 46. The capacitance between the sense electrode 26 and the touching object is represented as capacitor 50. In the ideal scenario, GND is equipotential and constant (i.e., no matter how large the pulse is on the drive line the potential of the GND node remains the same). Because of this, capacitors 46 and 50 have no effect on the charge transferred on sense electrode 26. Thus, the transferred charge integrated by integrator 30 will remain unaffected by these capacitors.

In operation, an object (e.g., a person's finger or a stylus) touches or comes in proximity to drive electrode 24 and/or sense electrode 26. The touch redirects some of the current from the drive electrode 24 to real ground through capacitor 48, the amount of which may be determined by the strength of the touch. With some of the current from the drive electrode 24 redirected through capacitor 48, integrator 30 integrates decreased current $I_Y$ through sense electrode 26. The decreased current $I_Y$ corresponds to a positive touching signal at touch-sensor controller 12. If current $I_Y$ decreases by a sufficient amount, touch-sensor controller 12 will determine that a touch has occurred. In certain systems, capacitances introduced by a touching object may affect the change in current through sense electrode 26 in adverse ways, resulting in a negative touching signal. An example of such a system is discussed below with respect to FIG. 4.

FIG. 4 illustrates an example equivalent circuit 32 for respective drive and sense electrodes of a touch sensor when a touch is occurring. In contrast to equivalent circuit 34 of FIG. 4, equivalent circuit 32 includes additional, non-ideal capacitances indicative of a non-ideal touch scenario. That is, equivalent circuit 32 illustrates a scenario with weak coupling between the touching object and ground. In particular embodiments, equivalent circuit 32 may represent at least a portion of the circuits of touch sensor 10. Similar to equivalent circuit 34, equivalent circuit 32 includes voltage source 22, drive electrode 24, sense electrode 26, integrator 30, and representative capacitors 42, 44, 46, 48 and 50. These components have functions similar to those described with respect to the corresponding components of FIG. 3, except that capacitors 46 and 50 do affect the current $I_Y$ or the transferred charge on sense electrode 26 in adverse ways. Equivalent circuit 32 also includes representative capacitors 52, 54, and 55. FIG. 4 introduces additional circuit elements into the model of FIG. 3, which have varying influences on the amount of current measured at sense electrode 26.

The capacitance between drive electrode 24 and the touching object is represented as capacitor 46. The capacitance between the sense electrode 26 and the touching object is represented as capacitor 50. Capacitor 52 represents the capacitance between the touching object and the real ground. Capacitor 54 represents the capacitance between device ground and real ground. Capacitor 55 represents the capacitance between the touching object and device ground.

In operation, an object (e.g., a person's finger or a stylus) touches or comes in proximity to drive electrode 24 and/or sense electrode 26. The effect of the touch should be reduced current through sense electrode 26. Reduced current at integrator 30 is converted into a positive touch signal in the digital domain by touch-sensor controller 12. A positive touch signal may not be recorded when a touch is occurring, however, because of weak coupling between the touching object and ground. Since capacitor 54 likely has a small value, there is likely weak coupling to ground. Because of the weak coupling, the effect of the touching object may be to inject current $I_{CXY}$ into sense electrode 26. Increased current at integrator 30 is converted into a negative touch signal in the digital domain by touch-sensor controller 12. This may result in touch-sensor controller 12 recording a negative touch signal instead of a positive touch signal even though an actual touch is occurring. In some cases, contrary to the desired effect, a stronger touch results in a stronger negative touch signal. In certain embodiments, the polarity of the change in current at integrator 30 may have the opposite effect. That is, increased current or transferred charge at integrator 30 is converted into a positive touch signal in the digital domain and vice versa. These anti-touch effects may be mitigated by modifying some additional capacitances introduced by the touching object. For example, capacitor 55 may be increased in various ways to increase the coupling between the touching object and device ground. As another example, capacitors 46 and 50 may be decreased to decrease the capacitance between the touching object and each of the drive electrode 24 and sense electrode 26, respectively. Thus, when a touch occurs, current will be directed away from integrator 30 instead of injected directly therein. Accordingly, a positive touch signal will be recorded in response to the touch by the touching object. FIGS. 5A-11B illustrate example touch sensors operable to mitigate anti-touch effects by using various electrode patterns.

Figure 5A:
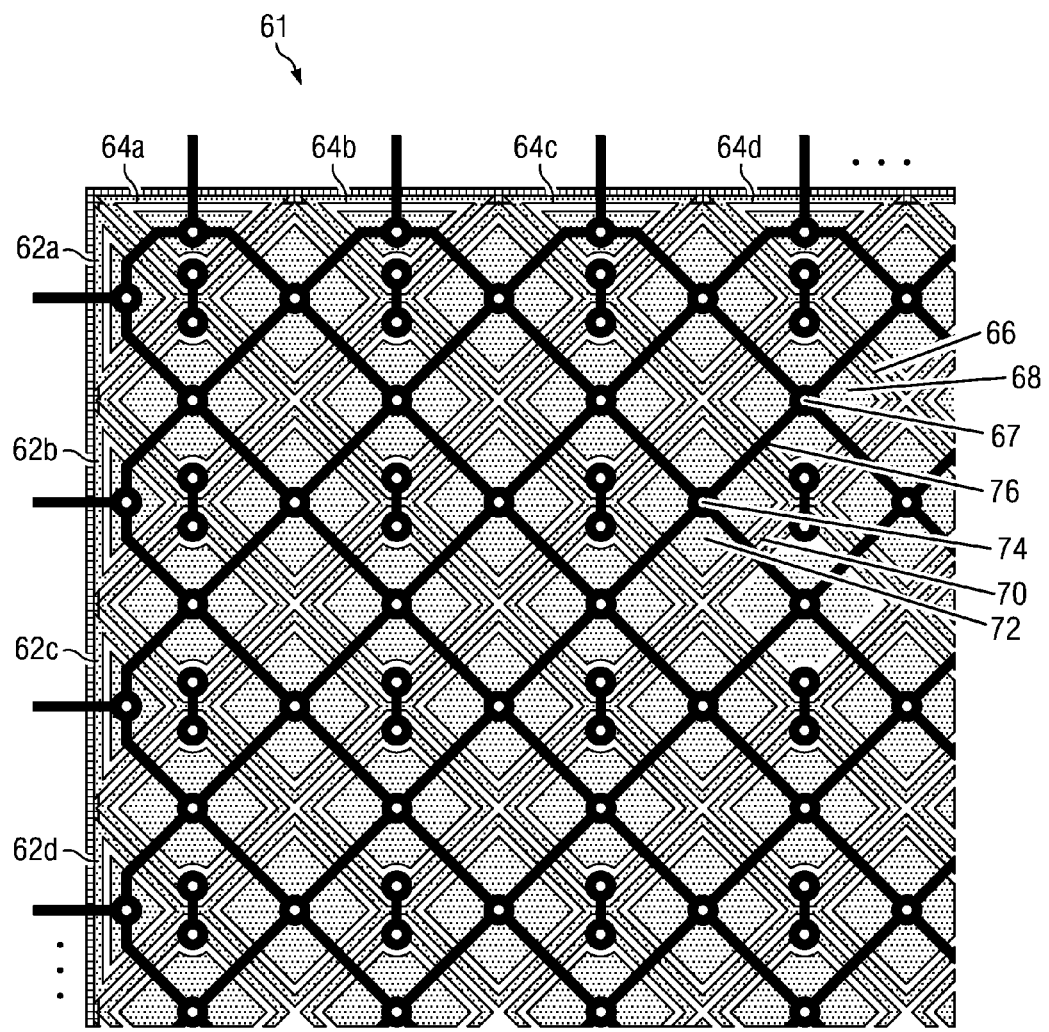
FIG. 5A illustrates an example embodiment of a touch sensor that includes ground areas enclosed within the outer boundary of drive and sense electrodes.

FIG. 5A illustrates an example embodiment of a touch sensor 61 implemented on a printed circuit board (PCB) that includes ground areas enclosed within the outer boundary of drive and sense electrodes. In particular embodiments, touch sensor 61 may be an example of touch sensor 10. Touch sensor 61 comprises drive lines 62a-d that run horizontally and sense lines 64a-d that run vertically. Drive lines 62 include diamond-shaped drive electrodes. For example, drive line 62b includes a diamond-shaped drive electrode 70. Sense lines 64 include diamond-shaped sense electrodes. For example, sense line 64d includes a diamond-shaped sense electrode 66. In particular embodiments, drive electrodes and sense electrodes of touch sensor 61 may comprise conductive material having any suitable shape, such as for example, a disc, square, rectangle, snowflake, another shape, or any suitable combination of the preceding.

Drive electrode 70 includes a ground area 72 enclosed within the boundary of drive electrode 70. Ground area 72 comprises a conductive material, which may be the same or different from the conductive material of drive electrode 70. Ground area 72 is part of a device ground node of touch sensor 61. Ground area 72 is also substantially diamond-shaped. Ground area 72 is coupled to device ground of touch sensor 61 through via 74 and interconnect track 76. Drive electrode 70 also includes a gap between its outer boundary and the outside edge of ground area 72, such that ground area 72 is not electrically coupled directly to drive electrode 70. The gap is substantially free of the conductive material forming the boundary of drive electrode 70. For example, the gap may be hallowed out. That is, a portion of the conductive material forming drive electrode 70 within the boundary of drive electrode 70 may be removed. Alternatively, the outside boundary of drive electrode 70 may be constructed using conductive material without filling gap between the boundary of drive electrode 70 and ground area 72 with the same conductive material that forms the boundary of drive electrode 70. The presence of ground area 72 may help to increase the capacitance between the touching object and device ground of touch sensor 61. With increased capacitance between the touching object and device ground, anti-touch effects may be reduced.

Sense electrode 66 includes a ground area 68 enclosed within the boundary of sense electrode 66. Ground area 68 is part of a device ground node of touch sensor 61. Ground area 66 is also substantially diamond-shaped. Ground area 68 is coupled to device ground of touch sensor 61 through via 67 and interconnect track 76. Sense electrode 66 also includes a gap between its outer boundary and the outside edge of ground area 68, such that ground area 68 is not electrically coupled directly to sense electrode 66. The gap is substantially free of the conductive material forming the boundary of sense electrode 66. For example, the enclosed area may be hallowed out. That is, a portion of the conductive material forming sense electrode 66 within the boundary of drive electrode 66 may be removed. Alternatively, the outside boundary of sense electrode 66 may be constructed using conductive material without filling the gap between the boundary of sense electrode 66 and ground area 68 with the same conductive material that forms the boundary of sense electrode 66. The presence of ground area 68 may help to increase the capacitance between the touching object and device ground of touch sensor 61. With increased capacitance between the touching object and device ground, anti-touch effects may be reduced.

The components of touch sensor 61 may have any suitable dimensions. For example, drive electrode 70 has a width of 0.2 mm. In alternative embodiments of touch sensor 61, drive electrode 70 may have widths of 0.1 mm, 0.5 mm, 1.0 mm, or any other suitable size. Sense electrode 66 has a width of 0.2 mm. In alternative embodiments, sense electrode 66 may have a width of 0.1 mm, 0.5 mm, 1.0 mm, or any other suitable size. Additionally, the gap between the drive electrodes and sense electrodes of touch sensor 61 is 0.2 mm. In alternative embodiments of touch sensor 61, the gap between the drive electrodes may be 0.03 mm, 0.1 mm, 0.5 mm, 1.0 mm, or any other suitable size.

Figure 5B:
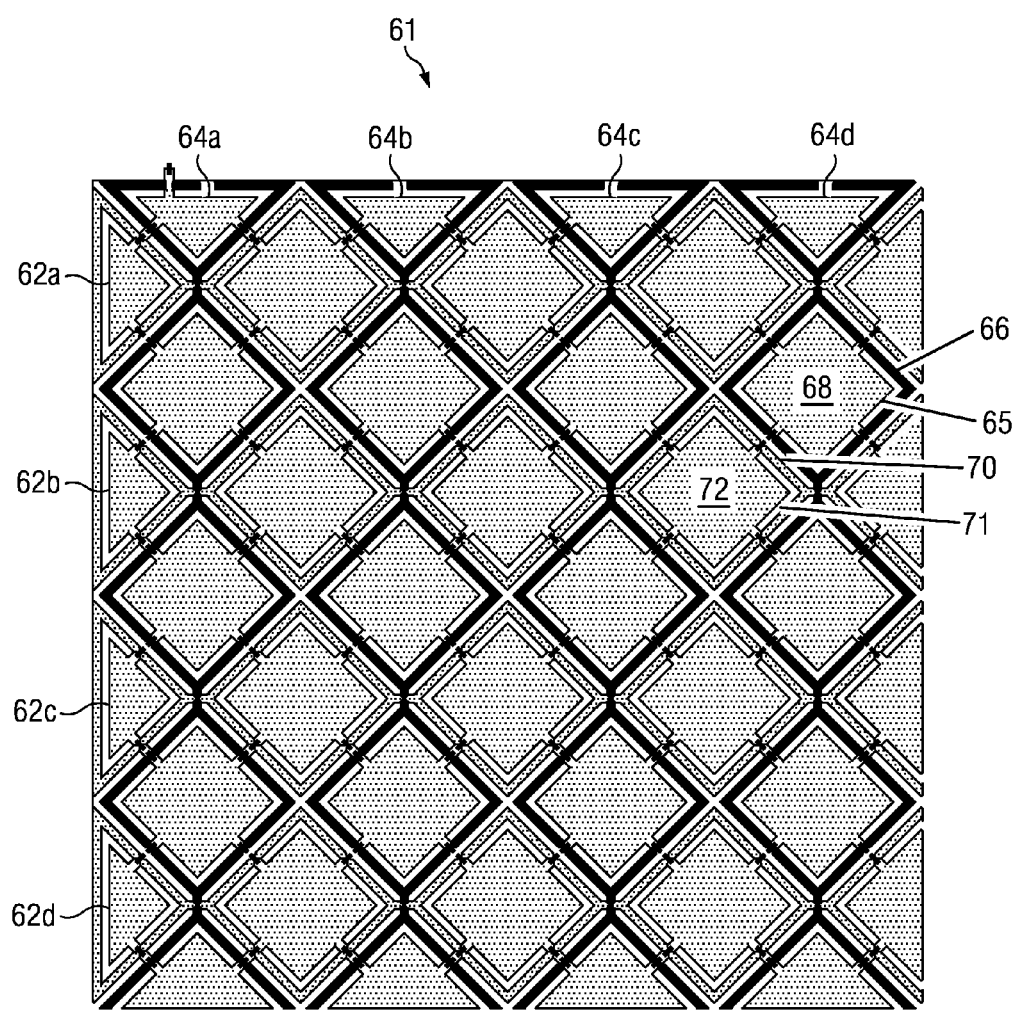
FIG. 5B illustrates another example embodiment of a touch sensor that includes ground areas enclosed within the outer boundary of drive and sense electrodes.

The embodiment of touch sensor 61 illustrated in FIG. 5A is implemented on a PCB. In alternative embodiments, touch sensor 61 may be implemented using any suitable materials, such as in ITO as shown in FIG. 5B. Touch sensor 61 of FIG. 5A includes vias 74 operable to connect the various components of touch sensor 61 together, where appropriate. Vias 74 and other vias shown in the remaining figures of this disclosure may be any suitable size and scale relative to the other components of touch sensor 61. Certain embodiments of touch sensor 61 may not use vias 74, such as embodiments implemented in ITO rather than on a PCB.

FIG. 5B illustrates an example embodiment of a touch sensor 61 implemented in ITO that includes ground areas enclosed within the outer boundary of drive and sense electrodes. In particular embodiments, touch sensor 61 may be an example of touch sensor 10. Touch sensor 61 of FIG. 5B includes similar components as touch sensor 61 of FIG. 5A, except that touch sensor 61 of FIG. 5B is implemented in ITO.

Figure 6A:
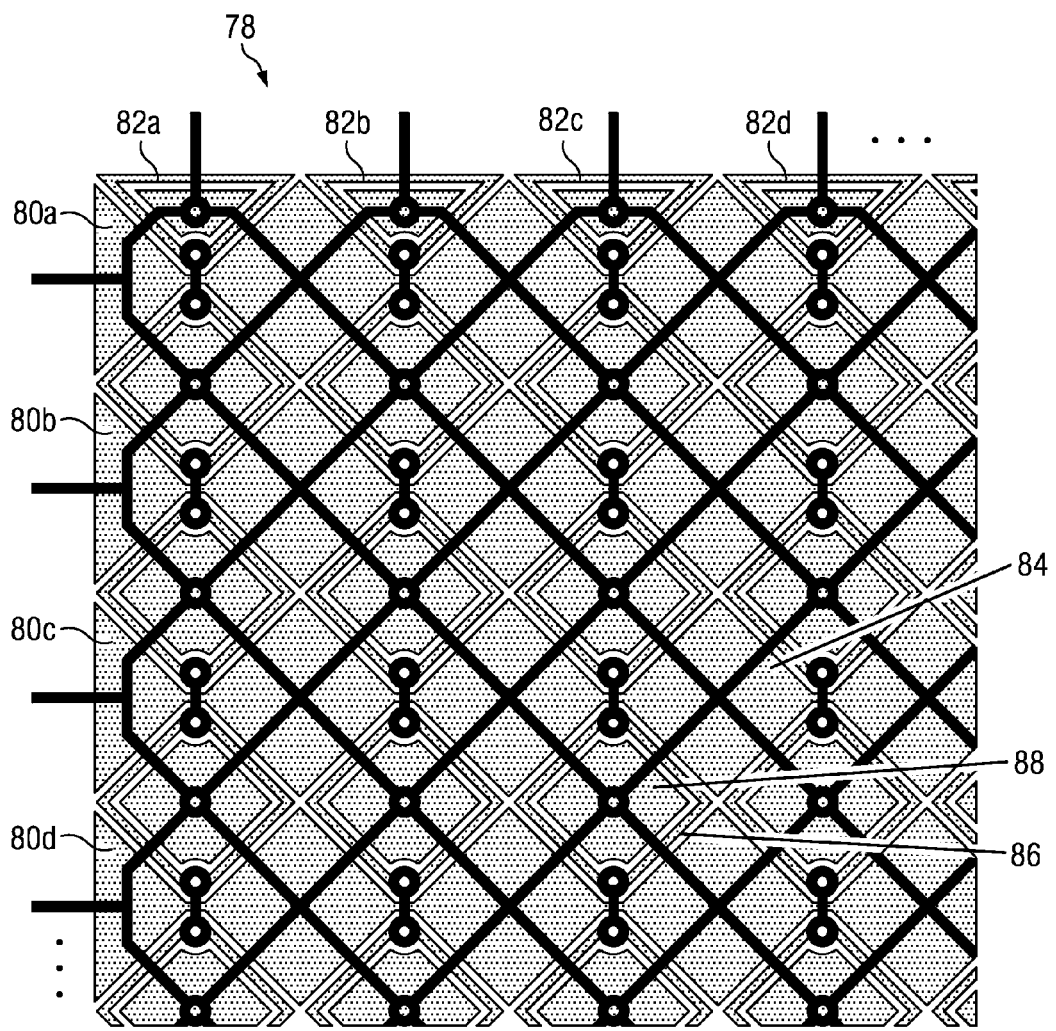
FIG. 6A illustrates an example embodiment of a touch sensor that includes ground areas enclosed within the outer boundary of the sense electrodes.

FIG. 6A illustrates an example embodiment of a touch sensor 78 implemented on a PCB that includes ground areas enclosed within the outer boundary of the sense electrodes. In particular embodiments, touch sensor 78 may be an example of touch sensor 10. In the embodiment depicted in FIG. 6A, the outer boundary of the drive electrodes do not enclose a ground area. Touch sensor 78 comprises drive lines 80a-d that run horizontally and sense lines 82a-d that run vertically. Drive lines 80 include diamond-shaped drive electrodes. For example, drive line 80c includes a diamond-shaped drive electrode 84. Sense lines 82 include diamond-shaped sense electrodes. For example, sense line 82c includes a diamond-shaped sense electrode 86. Drive electrodes and sense electrodes of touch sensor 78 may comprise conductive material having any suitable shape, such as for example, a disc, square, rectangle, snowflake, another shape, or any suitable combination of the preceding.

Drive electrode 84 does not enclose a ground area within its boundary. Sense electrode 86 includes a ground area 88 enclosed within the boundary of sense electrode 86. Ground area 88 comprises a conductive material, which may be the same or different from the conductive material of sense electrode 86. Ground area 88 is part of a device ground node of touch sensor 78. Ground area 88 is also substantially diamond-shaped. Sense electrode 86 also includes a gap between its outer boundary and the outside edge of ground area 88, such that ground area 88 is not electrically coupled directly to sense electrode 86. The gap is substantially free of the conductive material forming the boundary of sense electrode 86. For example, the enclosed area may be hallowed out. That is, a portion of the conductive material forming sense electrode 86 within the boundary of drive electrode 86 may be removed. Alternatively, the outside boundary of sense electrode 86 may be constructed without filling the gap between the boundary of sense electrode 86 and ground area 88 with the same conductive material that forms the boundary of sense electrode 86. The presence of ground area 88 may help to increase the capacitance between the touching object and device ground of touch sensor 78. With increased capacitance between the touching object and device ground, anti-touch effects may be reduced.

The components of touch sensor 78 may have any suitable dimensions. Sense electrode 86 has a width of 0.2 mm. In alternative embodiments, sense electrode 86 may have a width of 0.1 mm, 0.5 mm, 1.0 mm, or any other suitable size. Additionally, the gap between the drive electrodes and sense electrodes of touch sensor 78 is 0.2 mm. In alternative embodiments of touch sensor 61, the gap between the drive electrodes may be 0.03 mm, 0.1 mm, 0.5 mm, 1.0 mm, or any other suitable size.

The embodiment of touch sensor 78 illustrated in FIG. 6A is implemented on a PCB. In alternative embodiments, touch sensor 78 may be implemented using any suitable materials, such as in ITO as shown in FIG. 6B.

Figure 6B:
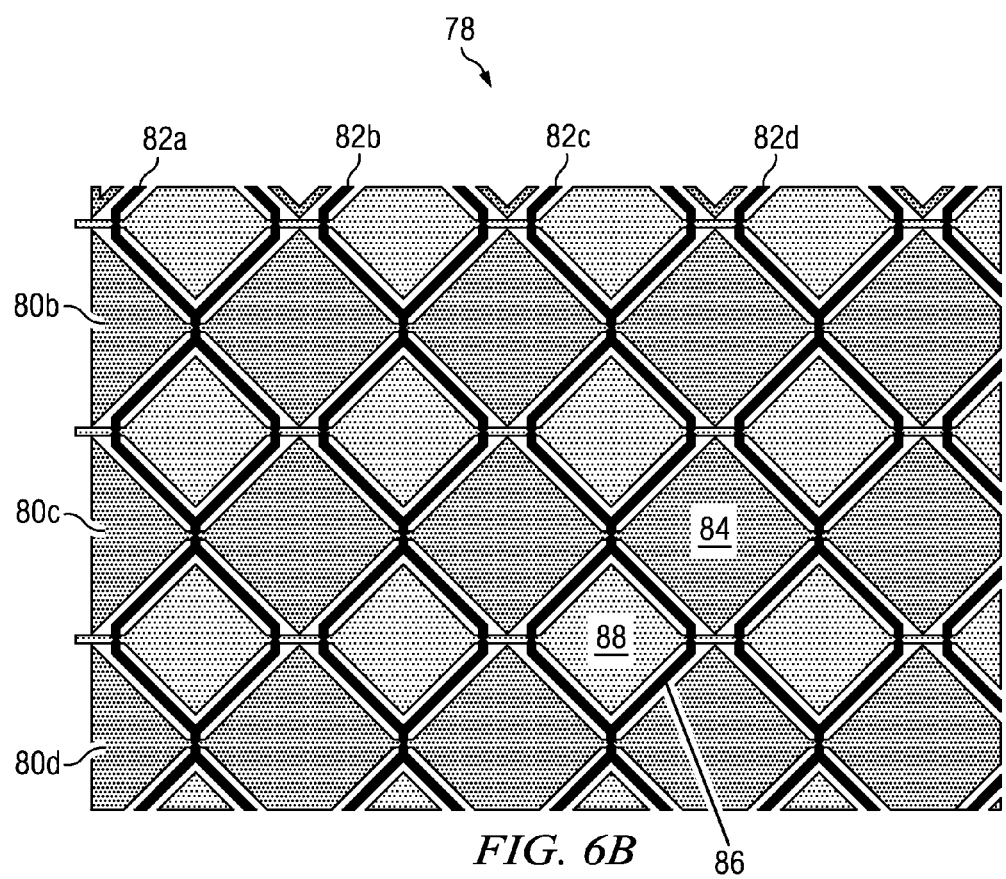
FIG. 6B illustrates another example embodiment of a touch sensor that includes ground areas enclosed within the outer boundary of the sense electrodes.

FIG. 6B illustrates an example embodiment of a touch sensor 78 implemented on a PCB that includes ground areas enclosed within the outer boundary of the sense electrodes. In particular embodiments, touch sensor 78 may be an example of touch sensor 10. Touch sensor 78 of FIG. 6B includes similar components as touch sensor 78 of FIG. 6A, except that touch sensor 78 of FIG. 6B is implemented in ITO.

Figure 7:
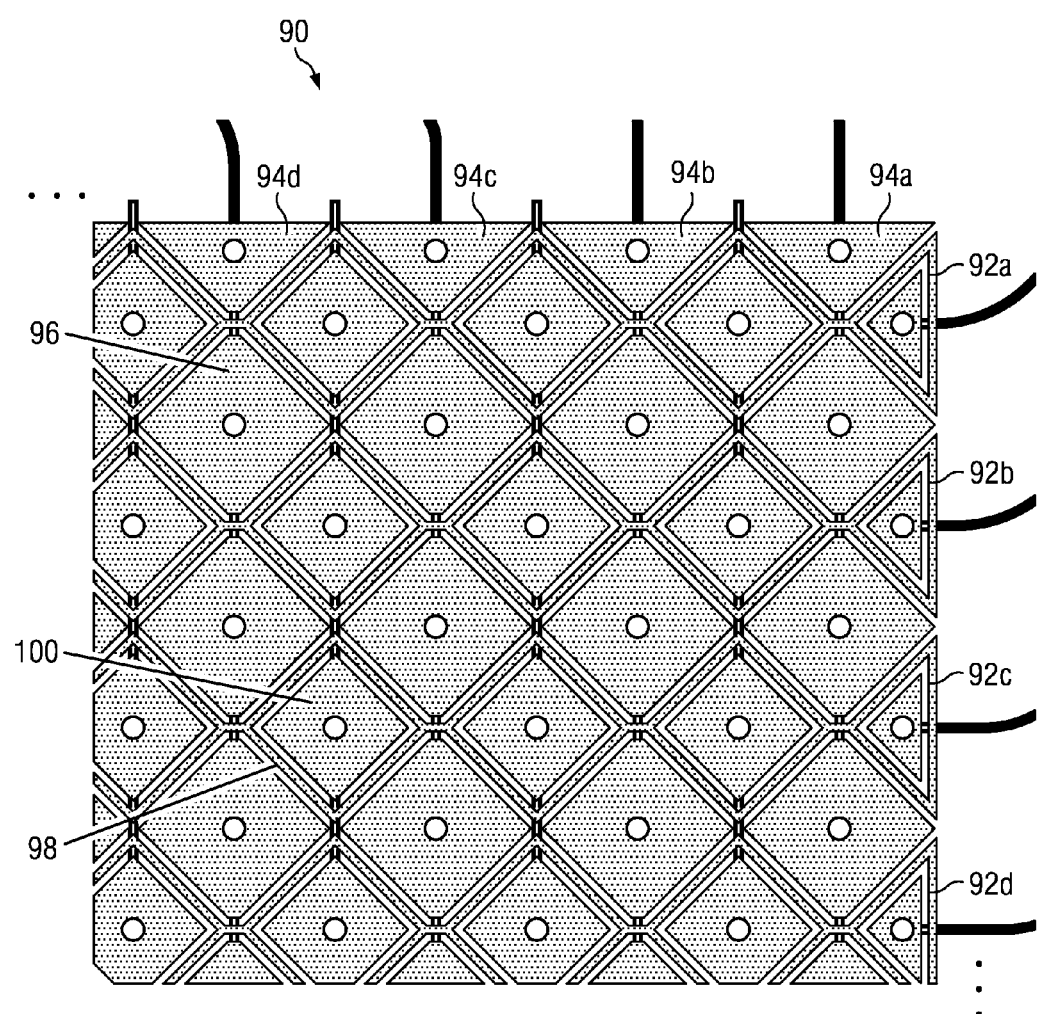
FIG. 7 illustrates an example embodiment of a touch sensor that includes ground areas enclosed within the outer boundary of the drive electrodes.

FIG. 7 illustrates an example embodiment of a touch sensor 90 that includes ground areas enclosed within the outer boundary of the drive electrodes. In particular embodiments, touch sensor 90 may be an example of touch sensor 10. In the embodiment depicted in FIG. 7, the outer boundaries of the sense electrodes do not enclose a ground area. Touch sensor 90 comprises drive lines 92*a-d* that run horizontally and sense lines 94*a-d* that run vertically. Drive lines 92 include diamond-shaped drive electrodes. For example, drive line 92*c* includes a diamond-shaped drive electrode 98. Sense lines 94 include diamond-shaped sense electrodes. For example, sense line 94*d* includes a diamond-shaped sense electrode 96. In particular embodiments, drive electrodes and sense electrodes of touch sensor 90 may comprise conductive material having any suitable shape, such as for example, a disc, square, rectangle, snowflake, another shape, or any suitable combination of the preceding.

Sense electrode 96 does not enclose a ground area within its boundary. Drive electrode 98 includes a ground area 100 enclosed within the boundary of drive electrode 98. Ground area 100 is part of a device ground node of touch sensor 90. Ground area 100 is also substantially diamond-shaped. Drive electrode 98 also includes a gap between its outer boundary and the outside edge of ground area 100, such that ground area 100 is not electrically coupled directly to drive electrode 98. The gap is substantially free of the conductive material forming the boundary of drive electrode 98. For example, the enclosed area may be hallowed out. That is, a portion of the conductive material forming drive electrode 98 within the boundary of drive electrode 98 may be removed. Alternatively, the outside boundary of drive electrode 98 may be constructed using conductive material without filling the gap between the boundary of drive electrode 98 and ground area 100 with the same conductive material that forms the boundary of drive electrode 98. The presence of ground area 100 may help to increase the capacitance between the touching object and device ground of touch sensor 90. With increased capacitance between the touching object and device ground, anti-touch effects may be reduced.

The components of touch sensor 90 may have any suitable dimensions. For example, drive electrode 98 has a width of 0.2 mm. In alternative embodiments of touch sensor 90, drive electrode 98 may have widths of 0.1 mm, 0.5 mm, 1.0 mm, or any other suitable size. Additionally, the gap between the drive electrodes and sense electrodes of touch sensor 90 is 0.2 mm. In alternative embodiments of touch sensor 90, the gap between the drive electrodes may be 0.03 mm, 0.1 mm, 0.5 mm, 1.0 mm, or any other suitable size.

Figure 8:
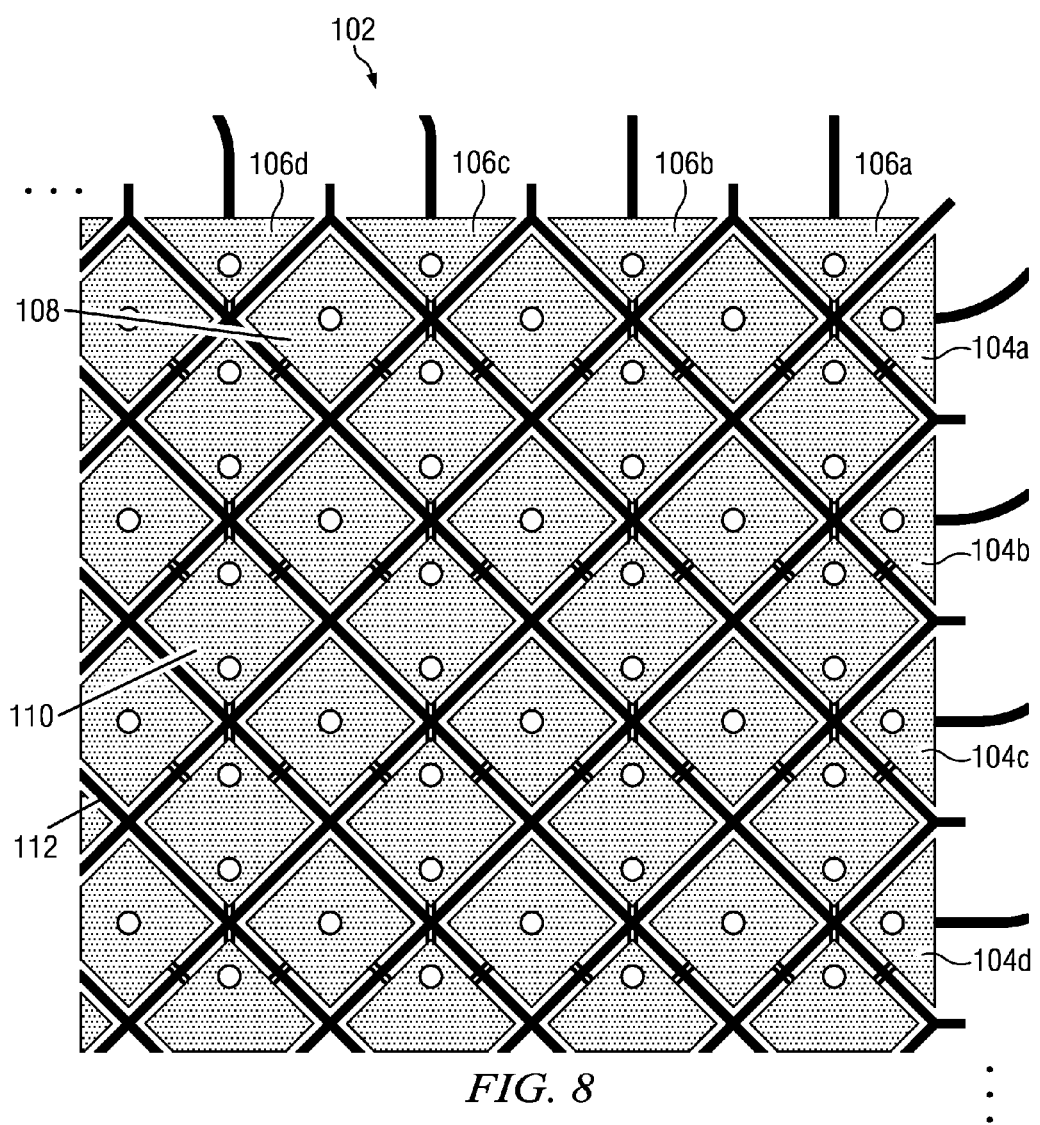
FIG. 8 illustrates an example embodiment of a touch sensor that includes ground tracking between drive and sense electrodes that is coupled to device ground of the touch sensor.

FIG. 8 illustrates an example embodiment of a touch sensor 102 that includes ground tracking between drive and sense electrodes that is coupled to device ground of touch sensor 102. In particular embodiments, touch sensor 102 may be an example of touch sensor 10. Touch sensor 102 comprises drive lines 104*a-d* that run horizontally and sense lines 106*a-d* that run vertically. Drive lines 104 include diamond-shaped drive electrodes. For example, drive line 104*a* includes a drive electrode 108. Sense electrodes 106 include diamond-shaped sense electrodes. For example, sense line 106*d* includes sense electrode 110. In particular embodiments, drive electrodes and sense electrodes of touch sensor 102 may comprise conductive material having any suitable shape, such as for example, a disc, square, rectangle, snowflake, another shape, or any suitable combination of the preceding.

Touch sensor 102 also includes ground track 112. Ground track 112 is electrically coupled to a device ground node of touch sensor 102 and is disposed between the drive electrodes and sense electrodes of touch sensor 102. Ground track 112 may be on the same layer as drive lines 104 and sense lines 106 in single layer implementations of touch sensor 102. In certain embodiments of touch sensor 102, drive lines 104 and sense lines 106 may be disposed on different layers of touch sensor 102. In these embodiments, ground track 112 may be disposed between individual drive electrodes on the layer with drive lines 104 and/or ground track 112 may be disposed between individual sense electrodes on the layer with sense lines 106. The presence of ground track 112 may help to increase the capacitance between a touching object and device ground of touch sensor 102. With increased capacitance between the touching object and device ground, anti-touch effects may be reduced.

The components of touch sensor 102 may have any suitable dimensions. The gap between the drive electrodes and sense electrodes of touch sensor 102 is 0.6 mm. In alternative embodiments of touch sensor 102, the gap between the drive electrodes may be 0.1 mm, 0.5 mm, 1.0 mm, or any other suitable size. Ground track 112 has a width of 0.2 mm in touch sensor 102. In alternative embodiments, ground track 112 may have any suitable width.

Figure 9A:
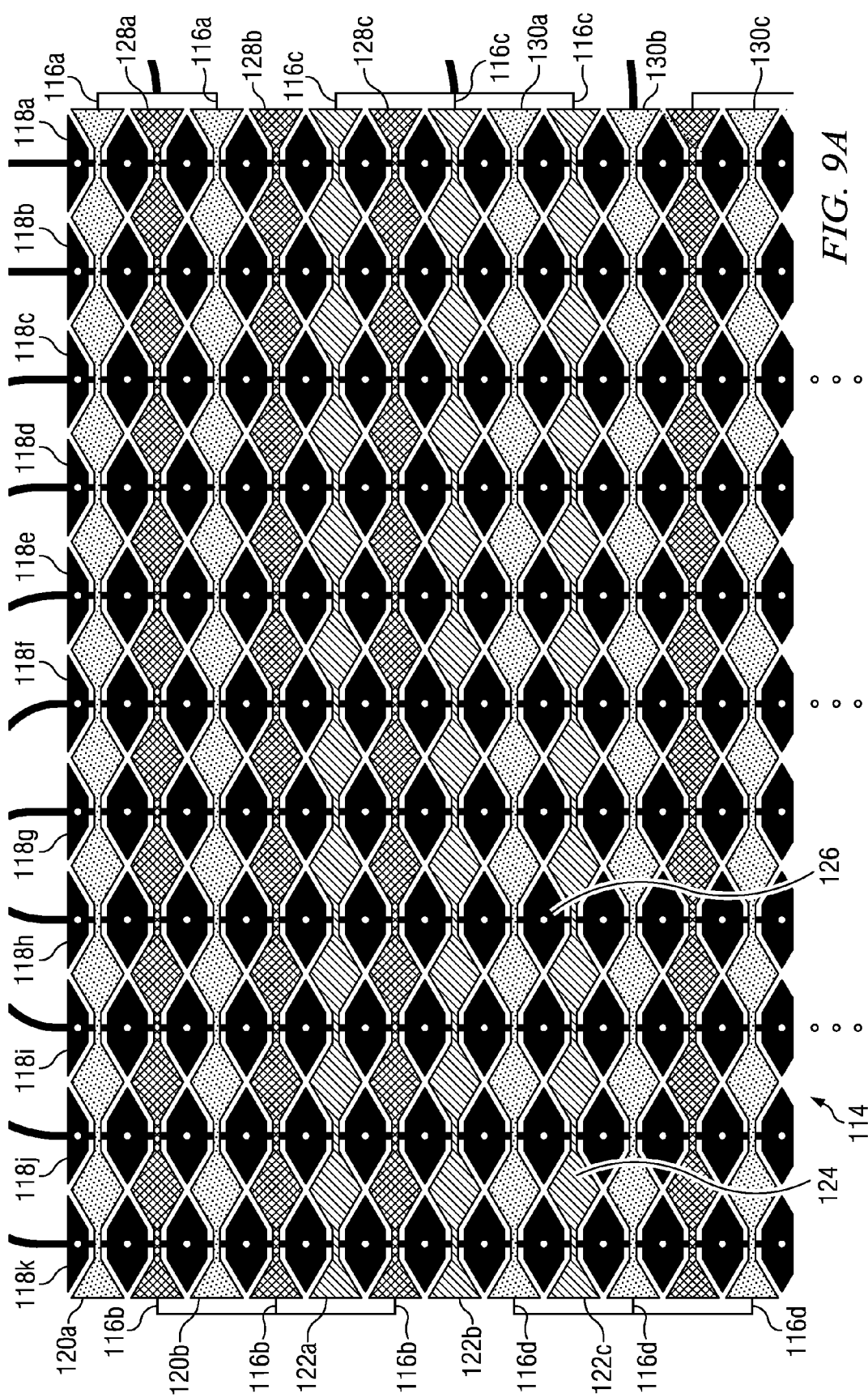
FIG. 9A illustrates an example embodiment of a touch sensor that includes interpolated drive lines.

FIG. 9A illustrates an example embodiment of a touch sensor 114 implemented in PCB that includes interpolated drive lines. In particular embodiments, touch sensor 114 may be an example of touch sensor 10. Touch sensor 114 comprises drive lines 116a-d that run horizontally and sense lines 108a-k that run vertically. Each drive line 116 includes a plurality of electrically-coupled, parallel segments. For example, drive line 116a includes segments 120a-b, where each segment 120 includes diamond-shaped drive electrodes. As another example, drive line 116c includes segments 122a-c, where each segment 122 includes diamond-shaped drive electrodes. For example, segment 122c includes diamond-shaped drive electrode 124. Sense lines 118 include six-sided sense electrodes. For example, sense line 118h includes six-sided sense electrode 126. In particular embodiments, drive electrodes and sense electrodes of touch sensor 114 may comprise conductive material having any suitable shape, such as for example, a disc, square, rectangle, snowflake, another shape, or any suitable combination of the preceding.

Drive lines 116 have their respective segments interpolated. That is, for any given drive line segment, the adjacent drive line segment is part of another drive line. For example, the segments of drive line 116a are interleaved with the segments of drive line 116b. Specifically, segment 120a of drive line 116a has segment 128a of drive line 116b as an adjacent drive line segment. As another example, segment 122b of drive line 116c has segment 128c of drive line 116b and segment 130a of drive line 116d as its adjacent drive line segments. With interpolated drive line segments, a touching object is more likely to cover segments from at least two drive lines. When one drive line segment 116 is driving, the adjacent drive lines 116 are effectively grounded. This may help to increase the capacitance between a touching object and device ground of touch sensor 114. With increased capacitance between the touching object and device ground, anti-touch effect may be reduced.

The components of touch sensor 114 may have any suitable dimensions. For example, drive electrode 124 has a width of 2 mm. In alternative embodiments of touch sensor 114, drive electrode 124 may have widths of 1.5 mm, 2.5 mm, 3.5 mm, or any other suitable size. Sense electrode 126 has a width of 5 mm. In alternative embodiments, sense electrode 126 may have a width of 3.5 mm, 4.5 mm, 6 mm, or any other suitable size. Additionally, the gap between the drive electrodes and sense electrodes of touch sensor 114 is 0.2 mm. In alternative embodiments of touch sensor 114, the gap between the drive electrodes may be 0.03 mm, 0.1 mm, 0.5 mm, or 1.0 mm.

The embodiment of touch sensor 114 illustrated in FIG. 9A is implemented on a PCB. In alternative embodiments, touch sensor 114 may be implemented using any suitable materials, such as in ITO as shown in FIG. 9B.

Figure 9B:
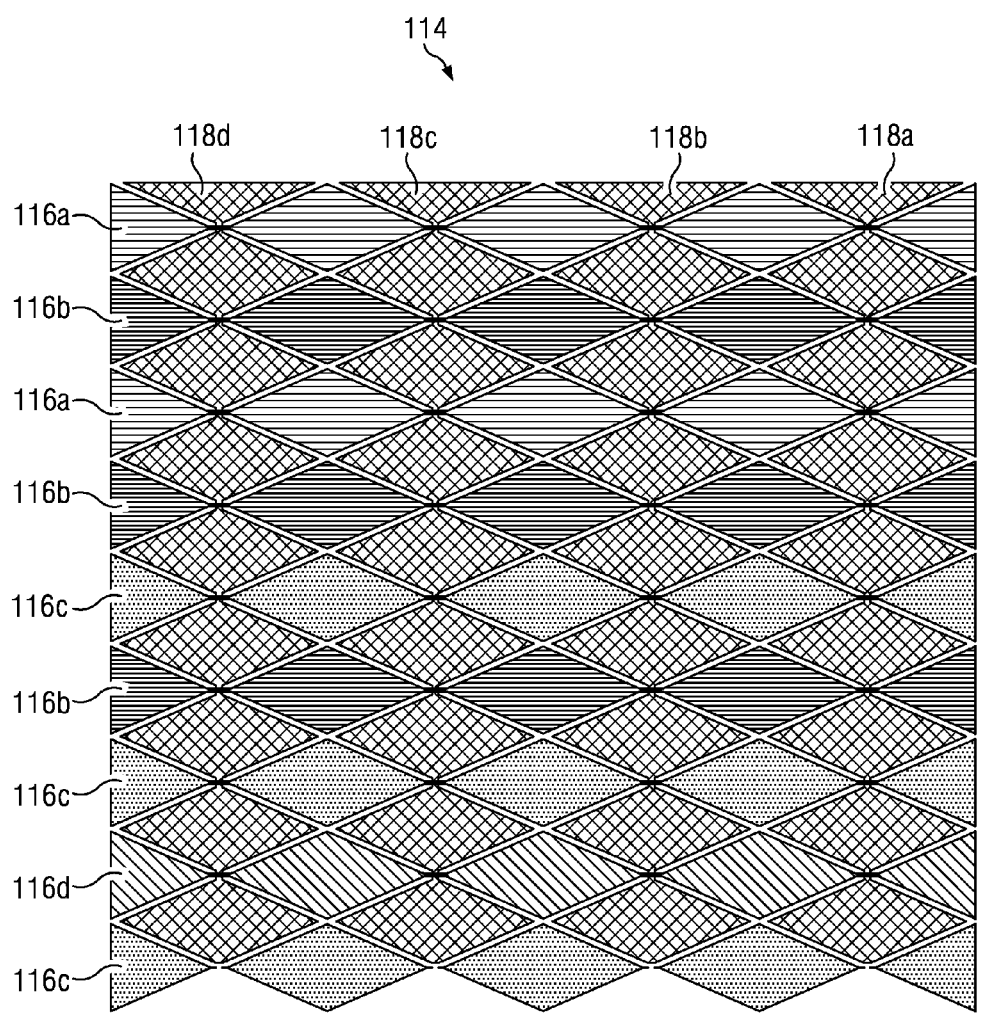
FIG. 9B illustrates another example embodiment of a touch sensor that includes interpolated drive lines.

FIG. 9B illustrates an example embodiment of a touch sensor 114 implemented in ITO that includes interpolated drive lines. In particular embodiments, touch sensor 114 may be an example of touch sensor 10. Touch sensor 114 of FIG. 9B includes similar components as touch sensor 114 of FIG. 9A, except that touch sensor 114 of FIG. 9B is implemented in ITO.

Figure 10A:
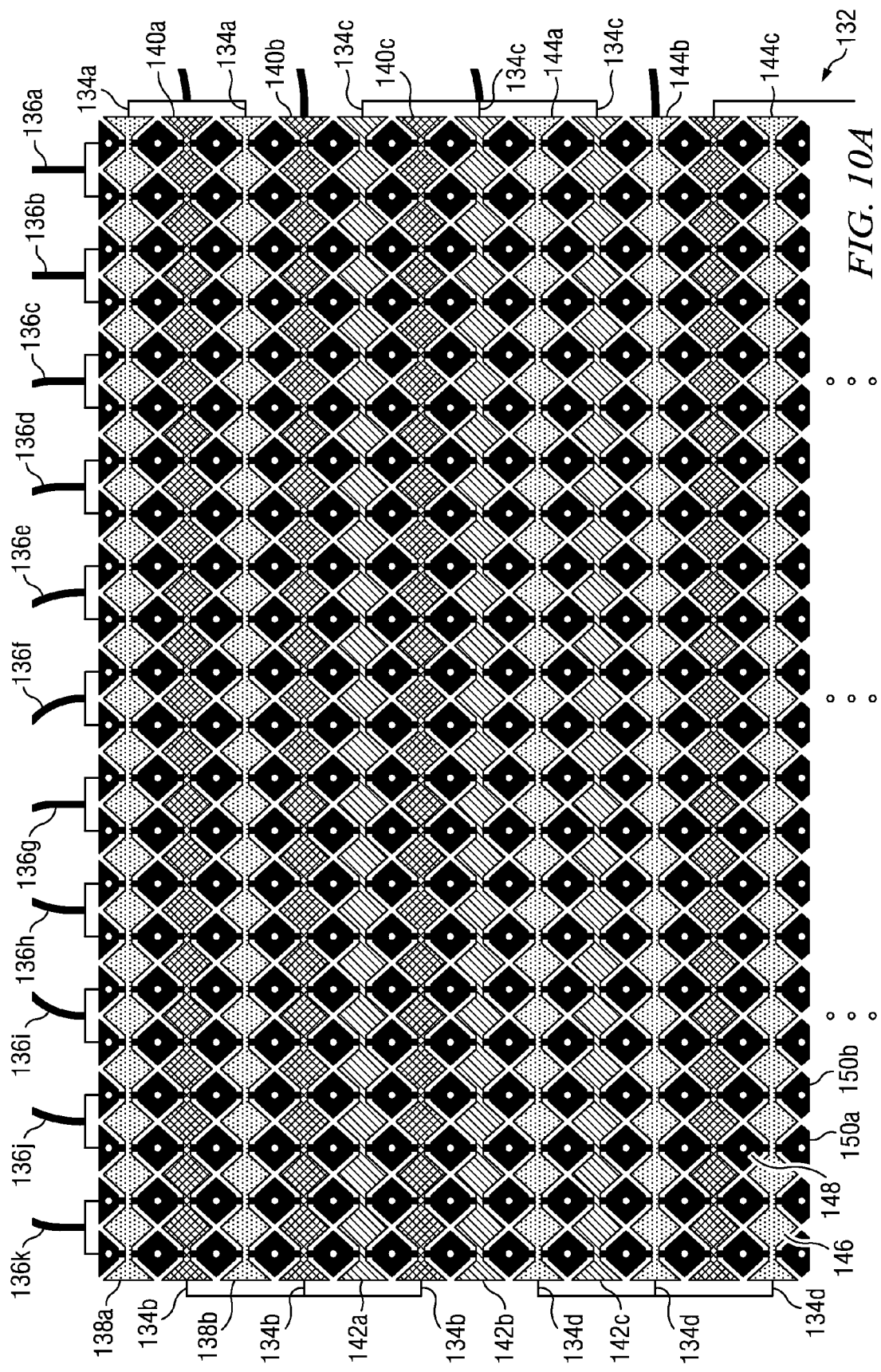
FIG. 10A illustrates another example embodiment of a touch sensor that includes interpolated drive lines.

FIG. 10A illustrates an example embodiment of a touch sensor 132 implemented on a PCB that includes interpolated drive lines. In particular embodiments, touch sensor 132 may be an example of touch sensor 10. Touch sensor 132 comprises drive lines 134a-d that run horizontally and sense lines 136a-k that run vertically. Each drive line 134 includes a plurality of electrically-coupled, parallel segments. For example, drive line 134a includes segments 138a-b, where each segment 138 includes diamond-shaped drive electrodes. As another example, drive line 134c includes segments 142a-c, where each segment 142 includes diamond-shaped drive electrodes. As still another example, drive line 134d includes segments 144a-d, where each segment 144 includes diamond-shaped drive electrodes. For example, segment 144c includes diamond-shaped drive electrode 146. Each sense line 136 includes a plurality of electrically-coupled, parallel segments. Each sense line segments includes six-sided sense electrodes. For example, segment 150a of sense line 136j includes six-sided sense electrode 148. In particular embodiments, drive electrodes and sense electrodes of touch sensor 132 may comprise conductive material having any suitable shape, such as for example, a disc, square, rectangle, snowflake, another shape, or any suitable combination of the preceding.

Drive lines 134 have their respective segments interpolated. That is, for any given drive line segment the adjacent drive line segment is part of another drive line. For example, the segments of drive line 134a are interleaved with the segments of drive line 134b. Specifically, segment 138a of drive line 134a has segment 140a of drive line 134b as an adjacent drive line segment. As another example, segment 142b of drive line 134c has segment 140c of drive line 134b and segment 144a of drive line 134d as its adjacent drive line segments. With interpolated drive line segments, a touching object is more likely to cover segments from at least two drive lines. When one drive line segment 134 is driving, the adjacent drive lines 134 are effectively grounded. This may help to increase the capacitance between a touching object and device ground of touch sensor 132. With increased capacitance between the touching object and device ground, anti-touch effect may be reduced.

The components of touch sensor 132 may have any suitable dimensions. For example, drive electrode 146 has a width of 2 mm. In alternative embodiments of touch sensor 132, drive electrode 146 may have widths of 1.5 mm, 2.5 mm, 3.5 mm, or any other suitable size. Sense electrode 148 has a width of 2 mm. In alternative embodiments, sense electrode 148 may have a width of 1.5 mm, 2.5 mm, 3.5 mm, or any other suitable size. Additionally, the gap between the drive electrodes and sense electrodes of touch sensor 132 is 0.2 mm. In alternative embodiments of touch sensor 132, the gap between the drive electrodes may be 0.03 mm, 0.1 mm, 0.5 mm, 1.0 mm, or any other suitable size.

The embodiment of touch sensor 132 illustrated in FIG. 10A is implemented on a PCB. In alternative embodiments, touch sensor 114 may be implemented using any suitable materials, such as in ITO as shown in FIG. 10B.

Figure 10B:
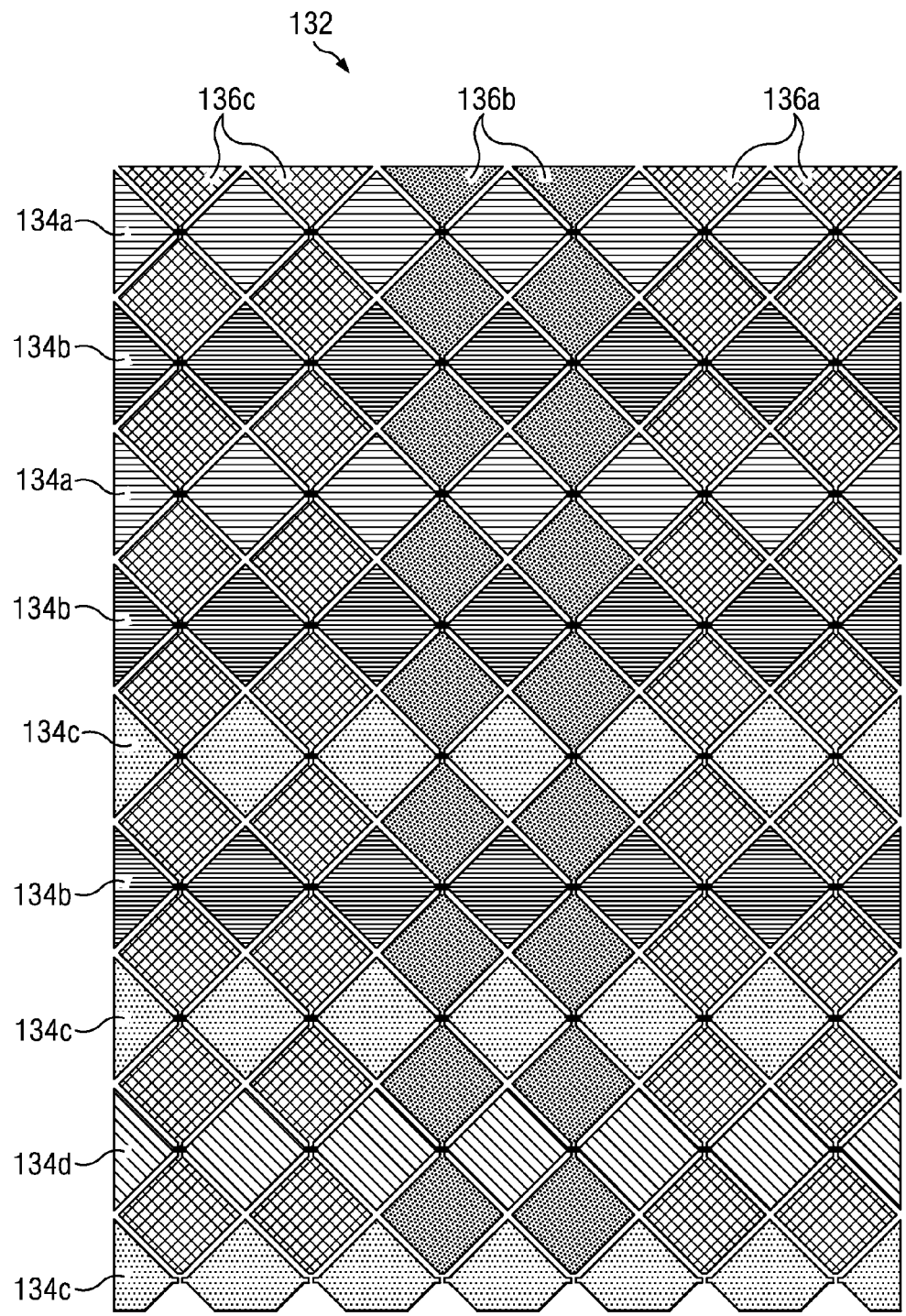
FIG. 10B illustrates another example embodiment of a touch sensor that includes interpolated drive lines.

FIG. 10B illustrates an example embodiment of a touch sensor 132 implemented in ITO that includes interpolated drive lines. In particular embodiments, touch sensor 132 may be an example of touch sensor 10. Touch sensor 132 of FIG. 10B includes similar components as touch sensor 131 of FIG. 10A, except that touch sensor 132 of FIG. 10B is implemented in ITO.

Figure 11A:
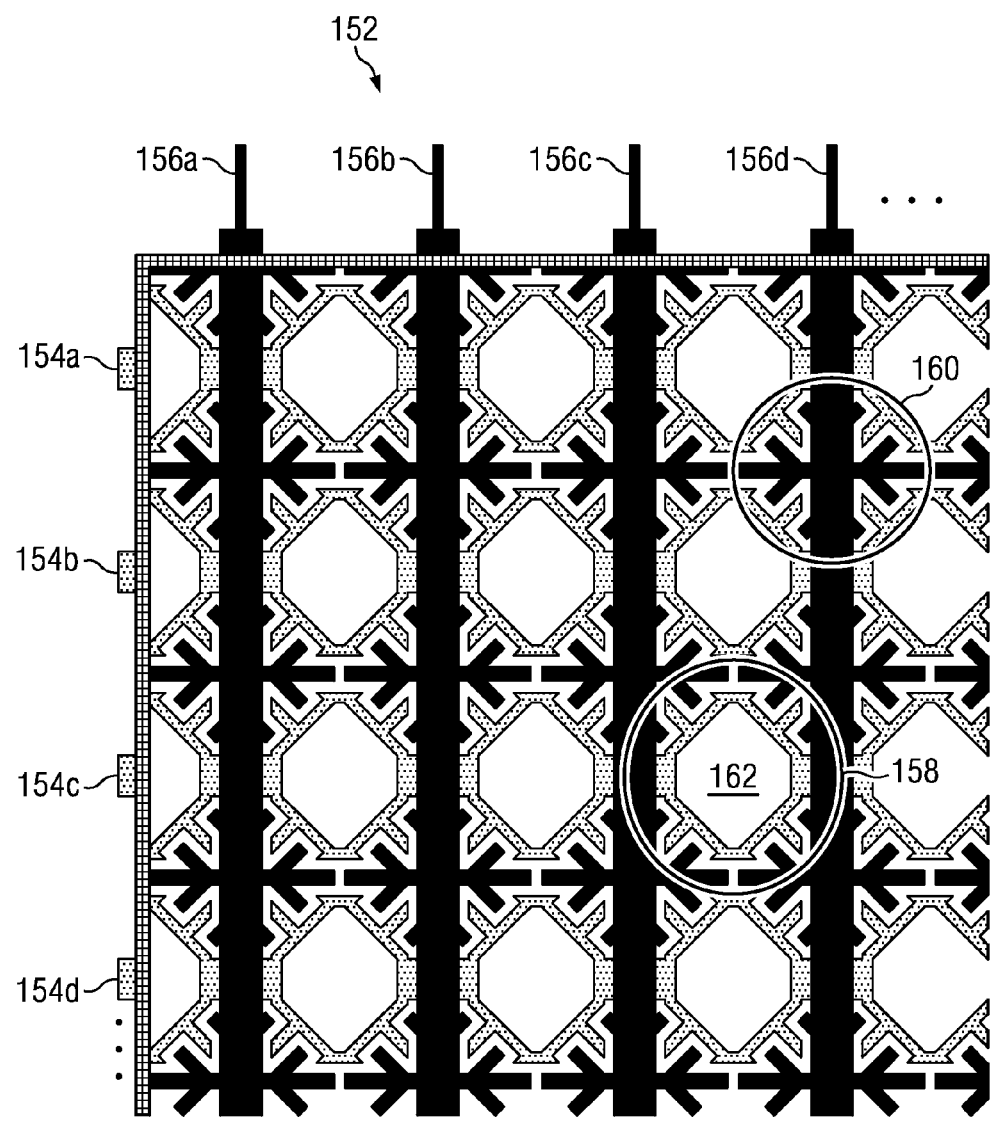
FIG. 11A illustrates an example embodiment of a touch sensor that includes hole areas enclosed within the outer boundary of the drive electrodes.

FIG. 11A illustrates an example embodiment of a touch sensor 152 implemented on a PCB that includes hole areas enclosed within the outer boundary of the drive electrodes. In particular embodiments, touch sensor 152 may be an example of touch sensor 10. In the embodiment depicted in FIG. 11, the outer boundary of the sense electrodes do not enclose a hallowed area. Touch sensor 152 comprises drive lines 154a-d and sense lines 156a-d. Drive lines 154 include snowflake-shaped drive electrodes. For example, drive line 154c includes a snowflake-shaped drive electrode 158. Sense lines 156 include snowflake-shaped sense electrodes. For example, sense line 156d includes a snowflake-shaped sense electrode 160. In particular embodiments, drive electrodes and sense electrodes of touch sensor 61 may comprise conductive material having any suitable shape, such as for example, a disc, square, rectangle, diamond, another shape, or any suitable combination of the preceding.

Drive electrode 158 includes a hole area 162 enclosed within the boundary of drive electrode 158. Hole area 162 is substantially free of the conductive material forming the boundary of drive electrode 158. For example, the enclosed area may be hallowed out. That is, a portion of the conductive material forming drive electrode 158 within the boundary of drive electrode 158 may be removed. Alternatively, the outside boundary of drive electrode 158 may be constructed using conductive material without filling the inner area of drive electrode 158 with the same conductive material.

In certain embodiments, hole area 162 may be partially or completely filled with a conductive material electrically coupled in any suitable fashion, such as to a ground node similar to electrodes described with respect to FIGS. 5A-7. In certain embodiments, hole area 162 may be partially or completely filled with a floating material. In particular embodiments, the floating material may be ITO, copper mess, conductive polymer, or any other suitable floating material. The floating material may be solid areas or divided into separate polygons to replicate the density or coverage as needed. The floating material is not electrically coupled to drive electrode 158. The presence of hole area 162 may help to reduce the capacitance between the drive lines of touch sensor 152 and the touching object. With reduced capacitance between the drive lines of touch sensor 152 and the touching object, anti-touch effects may be reduced.

The components of touch sensor 152 may have any suitable dimensions. For example, the spines of drive lines 154 and sense lines 156 may have any suitable spine width, such as 1 mm or a width in the range of 0.5 mm to 1.5 mm. The conductive elements (also known as fingers) branching off from spines of sense lines 156 and from drive electrodes in drive lines 154 may have any suitable width, such as 0.3 mm or a width in the range of 0.15 to 0.45. Additionally, the gap between the drive electrodes and sense electrodes of touch sensor 152 is 0.2 mm. In alternative embodiments of touch sensor 152, the gap between the drive electrodes may be 0.03 mm, 0.1 mm, 0.5 mm, 1.0 mm, or any other suitable size.

The embodiment of touch sensor 152 illustrated in FIG. 11A is implemented on a PCB. In alternative embodiments, touch sensor 152 may be implemented using any suitable materials, such as in ITO as shown in FIG. 11B.

Figure 11B:
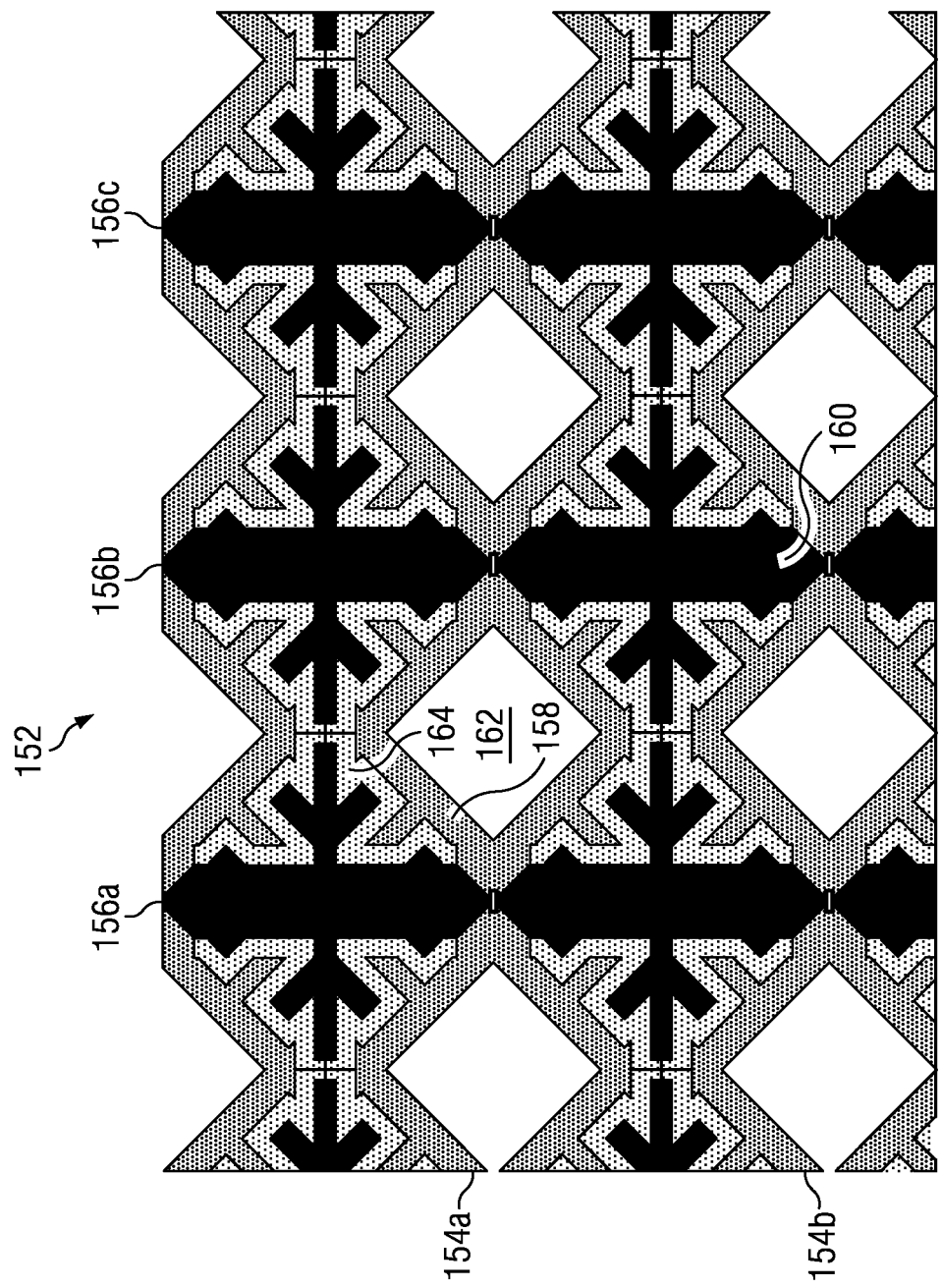
FIG. 11B illustrates another example embodiment of a touch sensor that includes hole areas enclosed within the outer boundary of the drive electrodes.

FIG. 11B illustrates an example embodiment of a touch sensor 152 implemented in ITO that includes hole areas enclosed within the outer boundary of the drive electrodes. In particular embodiments, touch sensor 152 may be an example of touch sensor 10. Touch sensor 152 of FIG. 11B includes similar components as touch sensor 152 of FIG. 11A, except that touch sensor 152 of FIG. 11B is implemented in ITO. Additionally, hole areas 162 shown in the embodiment of FIG. 11B are substantially diamond-shaped. Touch sensor 152 of FIG. 11B also shows in-fill areas 164 between the electrodes of drive lines 158 and the electrodes of sense lines 156, which are floating areas of touch sensor 152.

Modifications, additions, or omissions may be made to the touch sensor of FIGS. 5A-11B without departing from the scope of the invention. For example, each of the touch sensors illustrated may be implemented in single or in multiple layers, where appropriate. Additionally, the touch sensors illustrated in FIGS. 5A, 6A, 7, 8, 9A, 10A, and 11A are shown on a PCB. In alternative embodiments, any of these touch sensors may be constructed in ITO or any other suitable material. For example, the touch sensors of FIGS. 5B, 6B, 9B, 10B, and 11B are constructed in ITO. In certain embodiments, the electrode patterns of the touch sensors contemplated by this disclosure may be made from one layer of ITO formed on one side of a substrate. In these embodiments, the interconnects may be made using small metal or ITO bridges insulated from the sensor ITO layer by a thick insulator material. In addition, some of the electrode patterns of the touch sensors contemplated by this disclosure may be made from two layers of ITO where the complete pattern is split over the two layers. These embodiments may forego the use of ITO bridges.

In some embodiments, the tracking that interconnects the various components of the touch sensor may appear above or below the electrode layer. For example, in FIGS. 7 and 8 much of the interconnect tracking resides below the electrode layer, but may appear above the electrode layer in certain embodiments, such as interconnect track 76 of FIG. 5A. In some embodiments, the tracking may comprise FLM operable to enhance the coupling between the touching object and device ground due to low impedance.

As another example, techniques applied to only sense electrodes may also be applied to drive electrodes. Likewise, techniques applied to only drive electrodes may also be applied to sense electrodes. For example, the hole areas of the drive electrodes of as shown in the embodiments of FIGS. 11A-B can be applied to sense electrodes in particular embodiments. As another example, the interpolation of segments of drive lines as shown in the embodiments of FIGS. 9A-B and 10A-B can also be applied to sense electrodes in particular embodiments. Additionally, references to "parallel" and/or "perpendicular" components may be substantially parallel or substantially perpendicular due to any applicable circumstance, such as process variation during construction of any of the touch sensors described herein.

Moreover, the embodiments described in FIGS. 5A-11B may be combined in any suitable fashion. For example, a touch sensor may utilize hole areas for its drive electrodes and also have ground tracking disposed between its drive electrodes and sense electrodes. Furthermore, all the drive electrodes for a particular touch sensor do not have to be the same. Rather, each drive electrode may have a unique configuration employing any of the techniques discussed herein. The same applies to the sense electrodes for a particular touch sensor.

The touch sensors described in FIGS. 1-11B may be incorporated in a variety of devices, where appropriate. These devices include, by way of example and not limitation, a desktop computer, laptop computer, tablet computer, PDA, Smartphone, satellite navigation device, telephone, cell phone, portable media player, portable game console, kiosk computer, point-of-sale device, household appliance, automatic teller machine (ATM), any other device, or any combination of the preceding. These devices may include a touch screen display to present a wide variety of data, including a keyboard, a number keypad, program or application icons, and various other interfaces as desired. A user may interact with a device incorporating the touch sensors described in FIGS. 1-11B by touching a touch screen display with a single finger (or any other object), such as to select a program for execution or to type a letter on a keyboard displayed on the touch screen display. In addition, the user may use multiple touches, such as to zoom in or zoom out when viewing a document or image, or single touches, where appropriate. In particular embodiments, the touch screen display may change or may change only slightly during device operation.

Certain embodiments of the invention may provide one or more technical advantages. A technical advantage of one embodiment may be that a touch applied to a touching sensor enjoys reduced anti-touch effects associated with standard electrode patterns in touch sensors. Another technical advantage of one embodiment may be that the need for correction of anti-touch effects in the software of a touch controller may be reduced. In certain embodiments, one advantage may be the reduction of the possibility of an actual touch on a touch sensor resulting in a zero value touch signal. In certain embodiments, one advantage may be the reduction of the possibility of measuring one touch as multiple touches and/or measuring multiple touches as one touch. In certain embodiments, one advantage may be the reduction of the possibility of measuring touches of greater strength with smaller (or negative) touch signals.

Certain embodiments of the invention may include none, some, or all of the above technical advantages. One or more other technical advantages may be readily apparent to one skilled in the art from the figures, descriptions, and claims included herein.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

This disclosure encompasses all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A system comprising:
    a touch sensor, wherein the touch sensor comprises:
        an insulating substrate; and
        a plurality of electrodes disposed on the insulating substrate, the plurality of electrodes comprising a drive line having a plurality of drive electrodes and a sense line having a plurality of sense electrodes;
        wherein at least one of the plurality of drive electrodes comprises a first spine and at least one of the plurality of sense electrodes comprises a second spine such that the second spine intersects, in plan view, the first spine;
        wherein a plurality of branches protruding from the first spine are interleaved with a plurality of branches protruding from the second intersecting spine; and
        wherein at least one of the electrodes comprises a first conductive material having a hole portion substantially free of the first conductive material, the hole portion comprising a ground area that is part of a device ground node of the touch sensor independent of any coupling caused by an input object, wherein the ground area is conductive and is separated from the boundary of the at least one of the electrodes by a gap.

2. The system of claim 1, wherein the ground area is formed of the first conductive material.

3. The system of claim 1, wherein the ground area is formed of a second material distinct from the first conductive material.

4. The system of claim 1, wherein the at least one of the electrodes comprising the first conductive material is a drive electrode.

5. The system of claim 1, wherein the at least one of the electrodes comprising the first conductive material is a sense electrode.

6. The system of claim 1, wherein the at least one of the electrodes comprising the first conductive material has a snowflake pattern.

7. The system of claim 1, wherein the at least one of the electrodes comprising the first conductive material has a diamond pattern.

8. A system comprising:
    a touch sensor, wherein the touch sensor comprises:
        an insulating substrate;
        a first sense line disposed on the insulating substrate, the sense line comprising a plurality of sense electrodes;
        a first drive line disposed on the insulating substrate and arranged in a first plurality of segments, the first drive line comprising a first set of drive electrodes;
        a second drive line disposed on the substrate and arranged in a second plurality of segments, the second drive line comprising a second set of drive electrodes; and
        a third drive line disposed on the substrate and arranged in a third plurality of segments, the third drive line comprising a third set of drive electrodes;
        wherein a first segment of the first plurality of segments is disposed between a first and second segment of the second plurality of segments and a first segment of the third plurality of segments is disposed between the second and a third segment of the second plurality of segments;
        wherein the first, second, and third segments of the second plurality of segments are positioned to be grounded when the first segment of the first plurality of segments and the first segment of the third plurality of segments are driven by a drive signal such that when the first segment of the first plurality of segments and the first segment of the third plurality of segments are driven, segments adjacent to the first segment of the first plurality of segments and the first segment of the third plurality of segments are grounded; and
        wherein the first drive line with the first plurality of segments and the second drive line with the second plurality of segments are arranged on a single side of the insulating substrate along with the first sense line, the first sense line intersecting in plan view the first plurality of segments of the first drive line, the second plurality of segments of the second drive line, and the third plurality of segments of the third drive line.

9. The system of claim 8, wherein the first segment of the first plurality of segments is substantially parallel to a second segment of the first plurality of segments.

10. The system of claim 8, wherein the first plurality of segments is less than the second plurality of segments.

11. The system of claim 8, wherein the first sense line is arranged in a plurality of substantially parallel sense line segments.

12. The system of claim 8, wherein at least one the drive electrodes in the first set of drive electrodes comprises conductive material formed in a diamond pattern.

13. The system of claim 8, wherein at least one of the drive electrodes in the first set of drive electrodes comprises conductive material formed in a snowflake pattern.

14. The system of claim 8, wherein at least one the sense electrodes in the plurality of sense electrodes comprises conductive material formed in a diamond pattern.

15. The system of claim 8, wherein at least one the sense electrodes in the plurality of sense electrodes comprises conductive material formed in a snowflake pattern.

16. The system of claim 8, wherein:
   at least one of the drive electrodes in the first set of drive electrodes comprises a conductive material,
   the conductive material comprises a hole portion substantially free of the conductive material; and
   the hole portion comprises floating material, wherein the floating material is not electrically coupled directly to the at least one of the drive electrodes.

17. A touch sensor comprising:
   an insulating substrate;
   a plurality of electrodes disposed on the insulating substrate, the plurality of electrodes comprising a drive line having a plurality of drive electrodes and a sense line having a plurality of sense electrodes; and
   wherein a continuous ground track is disposed between a first drive electrode of the drive line and a second drive electrode of the drive line that is adjacent to the first drive electrode, the continuous ground track is also disposed between the first drive electrode of the drive line and a first sense electrode of the sense line that is adjacent to the first drive electrode, the continuous ground track is also disposed between the second drive electrode of the drive line and the first sense electrode of the sense line that is adjacent to the first drive electrode, and the continuous ground track is also disposed between the first drive electrode of the drive line and a second sense electrode of the sense line that is adjacent to the first drive electrode, wherein the continuous ground track is electrically coupled to a ground node independent of any coupling caused by an input object.

\* \* \* \* \*

UNITED STATES PATENT AND TRADEMARK OFFICE
CERTIFICATE OF CORRECTION

PATENT NO. : 9,634,660 B2  
APPLICATION NO. : 13/330257  
DATED : April 25, 2017  
INVENTOR(S) : Trend et al.

Page 1 of 1

It is certified that error appears in the above-identified patent and that said Letters Patent is hereby corrected as shown below:

In the Claims

Column 19, Line 13: After "one" and before "the" please insert -- of --.

Column 19, Line 19: After "one" and before "the" please insert -- of --.

Column 19, Line 22: After "one" and before "the" please insert -- of --.

Signed and Sealed this  
Fourth Day of July, 2017

Joseph Matal  
*Performing the Functions and Duties of the*  
*Under Secretary of Commerce for Intellectual Property and*  
*Director of the United States Patent and Trademark Office*